(12) United States Patent
Liu et al.

(10) Patent No.: US 9,590,076 B1
(45) Date of Patent: Mar. 7, 2017

(54) METHOD FOR MANUFACTURING A FINFET DEVICE

(71) Applicant: INSTITUTE OF MICROELECTRONICS, CHINESE ACADEMY OF SCIENCES, Beijing (CN)

(72) Inventors: Jinbiao Liu, Beijing (CN); Yao Wang, Beijing (CN); Guilei Wang, Beijing (CN); Tao Yang, Beijing (CN); Qing Liu, Beijing (CN); Junfeng Li, Beijing (CN)

(73) Assignee: Institute of Microelectronics, Chinese Academy of Sciences, Beijing (CN)

(*) Notice: Subject to any disclaimer, the term of this patent is extended or adjusted under 35 U.S.C. 154(b) by 0 days.

(21) Appl. No.: 14/402,303

(22) PCT Filed: Aug. 1, 2014

(86) PCT No.: PCT/CN2014/083497
§ 371 (c)(1),
(2) Date: Nov. 19, 2014

(87) PCT Pub. No.: WO2015/172439
PCT Pub. Date: Nov. 19, 2015

(30) Foreign Application Priority Data

May 12, 2014 (CN) .......................... 2014 1 0199311

(51) Int. Cl.
| | |
|---|---|
| *H01L 21/336* | (2006.01) |
| *H01L 29/66* | (2006.01) |
| *H01L 29/78* | (2006.01) |
| *H01L 21/306* | (2006.01) |
| *H01L 21/311* | (2006.01) |

(Continued)

(52) U.S. Cl.
CPC ...... *H01L 29/66795* (2013.01); *H01L 21/265* (2013.01); *H01L 21/30604* (2013.01); *H01L 21/31111* (2013.01); *H01L 29/0847* (2013.01); *H01L 29/785* (2013.01)

(58) Field of Classification Search
CPC ......... H01L 29/42392; H01L 29/78696; H01L 29/66795; H01L 29/0847; H01L 29/785; H01L 21/265; H01L 21/30604; H01L 21/31111
USPC ........ 438/283, 157, 151, 700, 197; 257/192, 257/392, 348, 351
See application file for complete search history.

(56) References Cited

U.S. PATENT DOCUMENTS

| | | | |
|---|---|---|---|
| 6,413,802 B1 * | 7/2002 | Hu ........................ | H01L 21/845 257/E21.703 |
| 6,716,686 B1 * | 4/2004 | Buynoski .......... | H01L 29/42384 257/E29.137 |

(Continued)

*Primary Examiner* — Mohammed Shamsuzzaman
(74) *Attorney, Agent, or Firm* — Christensen Fonder Dardi, PLLC

(57) ABSTRACT

A method for manufacturing a FinFET device, including providing a substrate; implementing a source/drain doping on the substrate; etching the doped substrate to form a source region and a drain region; forming a fin channel between the source region and the drain region; and forming a gate on the Fin channel. The fin and the gate are formed after the source/drain doping is implemented on the substrate, so that the source/drain doping is done as a doping for a planar device, which ensures the quality of the source/drain coping and improves the property of the FinFET device.

4 Claims, 5 Drawing Sheets

(51) Int. Cl.
*H01L 21/265* (2006.01)
*H01L 29/08* (2006.01)

(56) References Cited

U.S. PATENT DOCUMENTS

| | | | | |
|---|---|---|---|---|
| 6,852,576 | B2* | 2/2005 | Lin | H01L 21/823412 257/E21.618 |
| 7,279,375 | B2* | 10/2007 | Radosavljevic | H01L 29/41791 257/E21.444 |
| 7,374,986 | B2* | 5/2008 | Kim | H01L 29/42392 257/210 |
| 7,547,637 | B2* | 6/2009 | Brask | H01L 21/30608 438/717 |
| 7,709,312 | B2* | 5/2010 | Jin | H01L 29/66628 257/E21.431 |
| 7,960,794 | B2* | 6/2011 | Doyle | H01L 21/845 257/369 |
| 8,354,311 | B2* | 1/2013 | Forbes | B82Y 10/00 257/401 |
| 8,871,584 | B2* | 10/2014 | Tang | H01L 29/66795 257/E21.421 |
| 8,883,597 | B2* | 11/2014 | Chang | H01L 21/823807 257/365 |
| 9,337,307 | B2* | 5/2016 | Brask | H01L 29/42376 |
| 9,391,171 | B2* | 7/2016 | Chan | H01L 29/785 |
| 9,502,310 | B1* | 11/2016 | Li | H01L 21/823885 |
| 2004/0063286 | A1* | 4/2004 | Kim | H01L 21/823412 438/283 |
| 2006/0231907 | A1* | 10/2006 | Kim | H01L 29/42384 257/401 |
| 2007/0196973 | A1* | 8/2007 | Park | H01L 21/823412 438/197 |
| 2007/0231980 | A1* | 10/2007 | Forbes | B82Y 10/00 438/157 |
| 2008/0020537 | A1* | 1/2008 | Kim | H01L 29/42392 438/308 |
| 2008/0135888 | A1* | 6/2008 | Lee | H01L 29/045 257/255 |
| 2012/0292715 | A1* | 11/2012 | Hong | H01L 21/845 257/392 |
| 2013/0026539 | A1* | 1/2013 | Tang | H01L 29/66803 257/192 |
| 2013/0146942 | A1* | 6/2013 | Zhu | H01L 29/66795 257/190 |
| 2013/0200459 | A1* | 8/2013 | Adam | H01L 29/66545 257/348 |
| 2014/0191335 | A1* | 7/2014 | Yin | H01L 27/0886 257/401 |
| 2014/0302678 | A1* | 10/2014 | Paterson | H01L 21/3065 438/700 |
| 2015/0048453 | A1* | 2/2015 | Ching | H01L 29/7856 257/347 |
| 2015/0214339 | A1* | 7/2015 | Waite | H01L 29/66803 438/517 |
| 2015/0221648 | A1* | 8/2015 | Gimbert | H01L 27/1203 257/351 |
| 2016/0093720 | A1* | 3/2016 | Chudzik | H01L 29/7848 438/157 |
| 2016/0111495 | A1* | 4/2016 | Brand | H01L 29/0673 438/283 |

* cited by examiner

METHOD FOR MANUFACTURING A FINFET DEVICE

CROSS-REFERENCE TO RELATED APPLICATION(S)

This application is a National Phase application of PCT Application No. PCT/CN2014/083497, filed on Aug. 1, 2014, entitled "METHOD FOR MANUFACTURING A CONTRACT ELECTRODE AND A SEMICONDUCTOR DEVICE," which claimed priority to a Chinese Application with an application number of 201410199311.5, filed on May 12, 2014 and entitled "METHOD FOR MANUFACTURING A FINFET DEVICE," the contents of which are incorporated herein by reference in their entirety.

TECHNICAL FIELD

The present disclosure relates to the semiconductor manufacturing field, and particularly to a method for manufacturing a FinFET device.

BACKGROUND

As the size of a planar semiconductor devices continue to shrink, the short channel effect becomes more prominent. It is an important trend for the next generation device to improve the ability of gate control, such as a multiple-gates device of a FinFET (Fin Field Effect Transistor). The FinFET is a transistor having a Fin channel structure, which utilizes several surfaces of a thin Fin as the channel to increase the operating current so as to avoid a short channel effect in a conventional transistor.

During an actual process for manufacturing a FinFET device, there is an important challenge for manufacturing the source/drain doping region of a FinFET. In a planar device, the ions are directly implanted to the surface of a planar device and then the device is annealed to activate the implanted ions, so doping concentration is uniform. When implantation for the source/drain region of a FinFET is implemented, it is required to synchronously implant at the top portion and spacer portions of the Fin to get an approximately identical concentration distribution, i.e., a conformal doping. In order to implement such an object, it is common to utilize a large-angle implantation or a plasma doping.

However, a conventional large-angle implantation would be affected by a shadow effect caused by a small interval of the Fin, which leads to a nonuniform doping in which the doping concentration at the sides of the Fin is lower than that at the top of the Fin. Although a plasma doping may achieve a uniform doping, such a plasma doping can't filter in form of quality and may introduce other defects so as to affect the characteristic of the device.

SUMMARY

The object of the present disclosure is to solve the defects mentioned above and to provide a method for manufacturing a FinFET device which implements a conformal doping.

Thus, the present disclosure provides a method for manufacturing a FinFET device comprising: providing a substrate; implementing a source/drain doping on the substrate; etching the doped substrate to form a source region and a drain region; forming a fin channel between the source region and the drain region; and forming a gate on the Fin channel.

Alternatively, the step of forming a fin channel between the source region and the drain region may comprise: forming a dielectric layer on the substrate except for the source region and the drain region; planarizing until exposing the source region and the drain region; etching the dielectric layer between the source region and the drain region to form a fin channel region in the dielectric layer; forming a fin channel within the fin channel region; and removing at least the dielectric layer with some certain thickness.

Alternatively, the fin channel is formed in the fin channel region by a selectively epitaxial growth.

Alternatively, the dielectric layer with some certain thickness is removed, and the remaining dielectric layer functions as an isolation structure.

Alternatively, the source/drain doping on the substrate is implemented by an ion implantation or an epitaxial doping.

Alternatively, the doping concentration for the source and drain regions is larger than $1e20$ $cm^{-3}$.

The method for manufacturing a FinFET device provided by the embodiment of the present disclosure forms a Fin and a gate after implementing a source/drain doping on the substrate, so that the doping for the source/drain is identical to that of a planar device to ensure the quality of the source/drain doping and to improve the property of the FinFET device.

BRIEF DESCRIPTION OF THE DRAWINGS

The above and/or additional aspects and advantages of the present disclosure become apparent and appreciated to be understood in the following description in conjunction with the accompany figures.

DETAILED DESCRIPTION

The embodiment of the present disclosure will be illustrated in detail below, the example of which is shown in the accompany figures and in which identical or similar reference signs are used to represent identical or similar elements or element having identical or similar functions throughout the description. The embodiment illustrated by referring to the accompany figures is exemplified, which is not to limit but to explain the present disclosure.

The schematic views of the laminated structure according to the embodiment of the present disclosure are show in the accompany figures. These figures are not drawn to scale, in which for clarity, some details are exaggerated and some details are omitted. Various regions, shapes of layers and their relative sizes and relative positions are exemplified, and in practice, there may be some deviation cased by manufacturing tolerance or technical limitation. Those skilled in the art may design regions/layers with different shapes, sizes and relative positions according to actual requirement.

Figure 1:
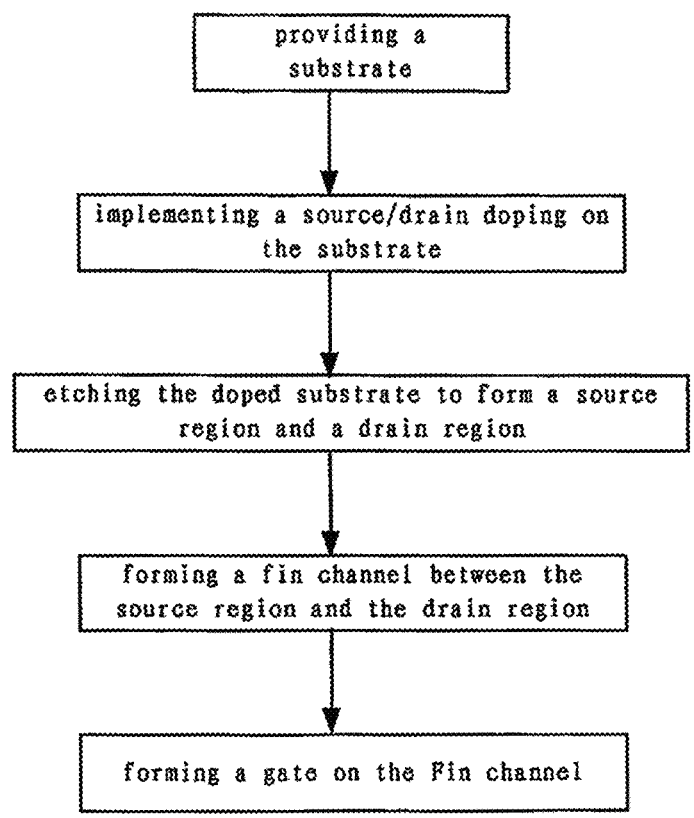
FIG. 1 shows a flowchart of a method for manufacturing a FinFET device according to one embodiment of the present disclosure.

In order to implement a conformal doping of the ion implantation for a FinFET device, the present disclosure proposes a method for manufacturing a FinFET device, as shows in FIG. 1, which comprises steps of: providing a substrate; implementing a source/drain doping on the substrate; etching the doped substrate to form a source region and a drain region; forming a fin between the source region and the drain region; and forming a gate on the Fin.

In the present disclosure, the fin and the gate are formed after the source/drain doping is implemented on the substrate, so that the source/drain doping is done as the doping for a planar device, which ensures the quality of the source/drain coping and improves the property of the FinFET device.

In order to better understand the present disclosure, a detailed description is provided in the following in conjunction with the particular embodiments.

Figure 2:
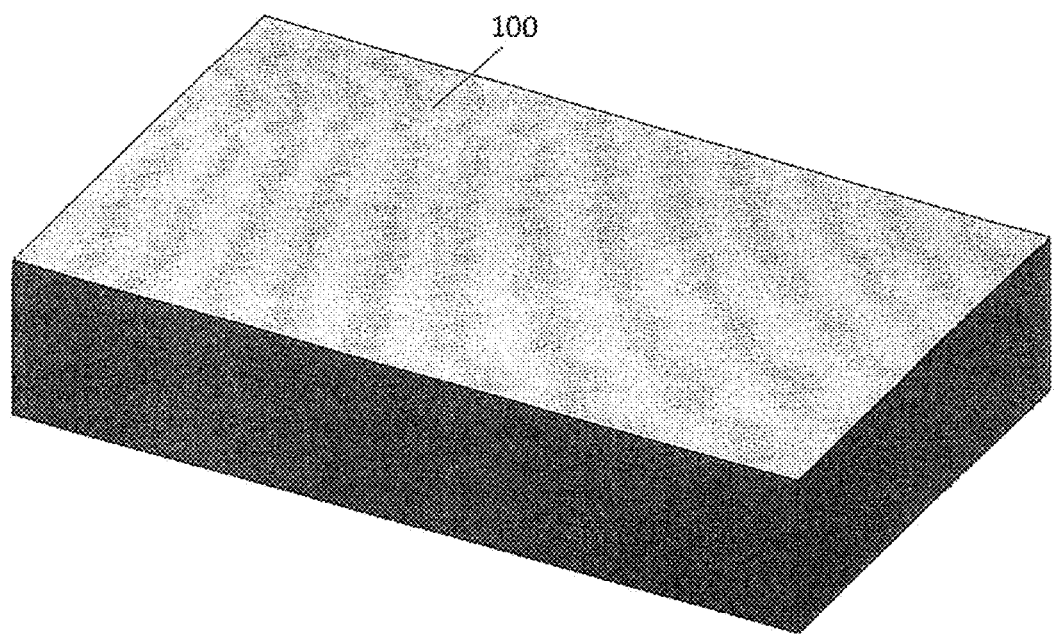
FIG. 2-8 show schematic views of the FinFET device at various stages according to embodiments of the present disclosure.

First of all, at a step of S01, a semiconductor substrate is provided, as shown in FIG. 2.

In the present disclosure, the semiconductor substrate may be a Si substrate, a Ge substrate, a SiGe substrate and the like. In the present embodiment, the substrate is a bulk silicon substrate.

Afterwards, the source/drain doping is implemented on the substrate, as shown in FIG. 2.

During doping the substrate, a method for doping source/drain for a planar device may be employed. For example, an ion implantation or an epitaxial doping may be utilized for doping.

In the present embodiment, a p-type or an n-type dopant or impurity may be implanted into the substrate and then is annealed according to the desired transistor structure so as to implement the doping, in which the doping concentration for the source/drain region is larger than 1e20 cm$^{-3}$. In the other embodiment, the doping may be implemented by an epitaxial doping on the substrate.

Figure 3:
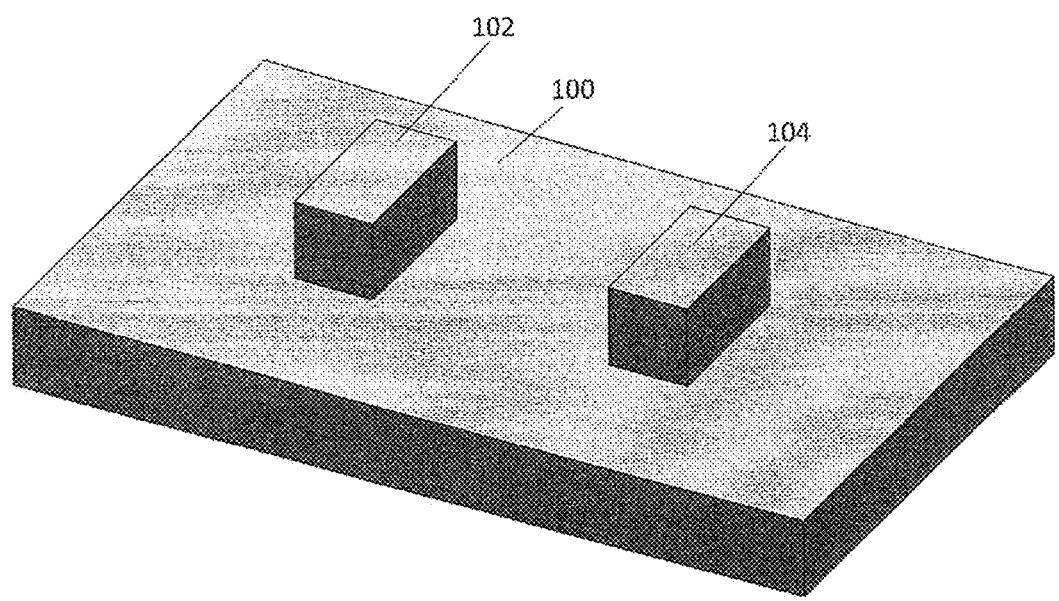

Afterwards, the doped substrate is etched to form a source region 102 and a drain region 103, as shown in FIG. 3.

In the present embodiment, first of all, a patterned hard mask is formed on the doped substrate, e.g., silicon nitride. Afterwards, the substrate is further etched by using an etching technique, such as RIE (reactive ion etching), and being shielded by the hard mask, so as to form the source region and the drain region. Finally, the hard mask is removed.

Figure 5:
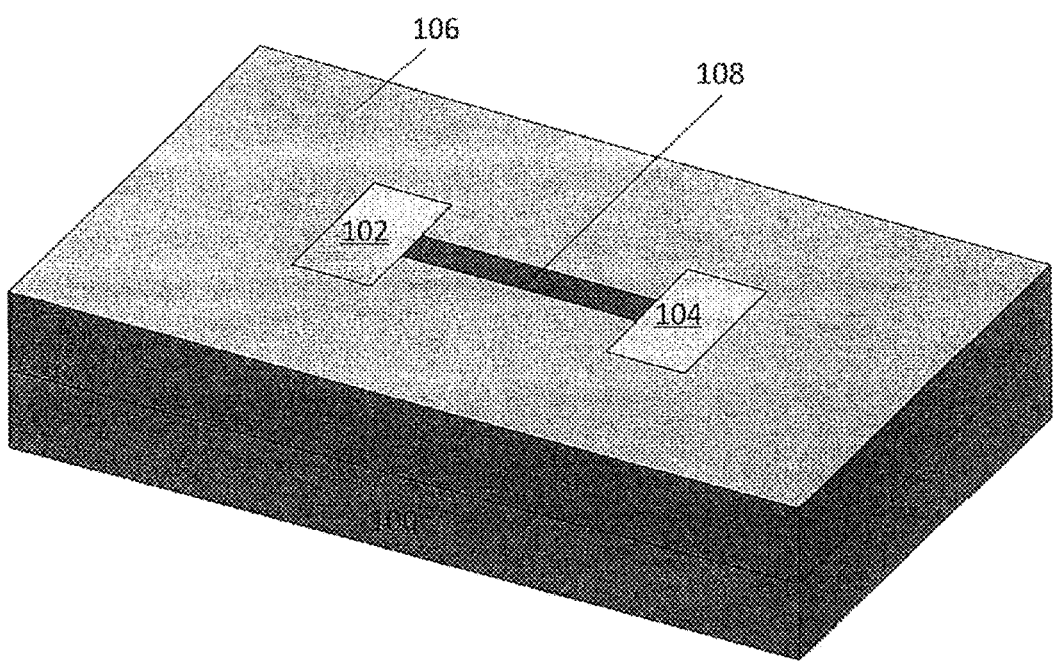

Afterwards, a fin channel 108 is formed between the source region 102 and the drain region 104, as shown in FIG. 5.

Figure 4:
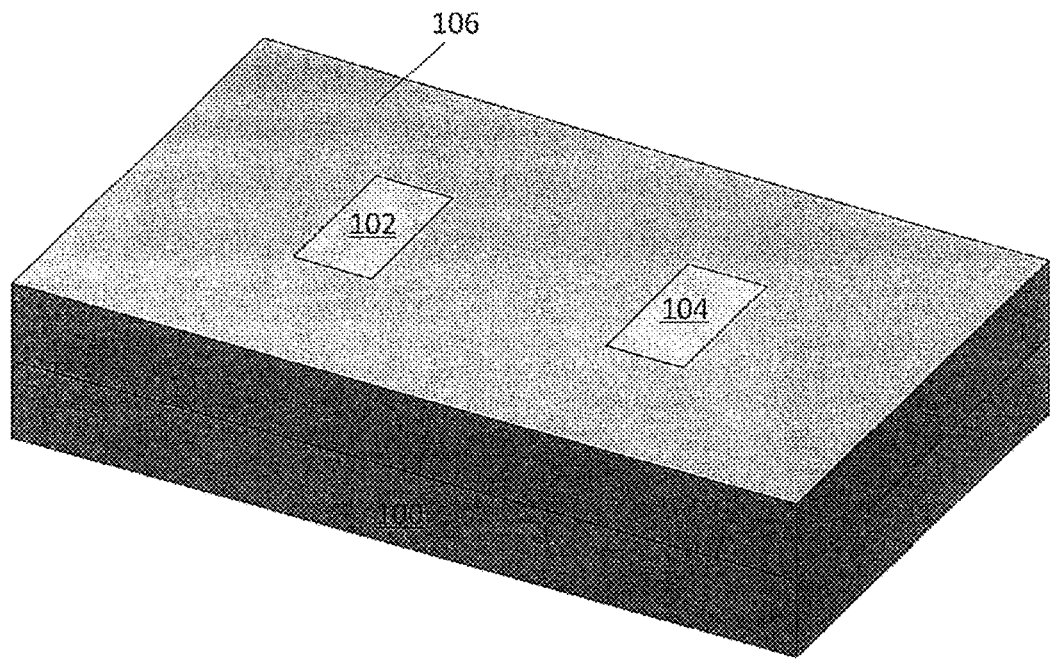
Figure 6:
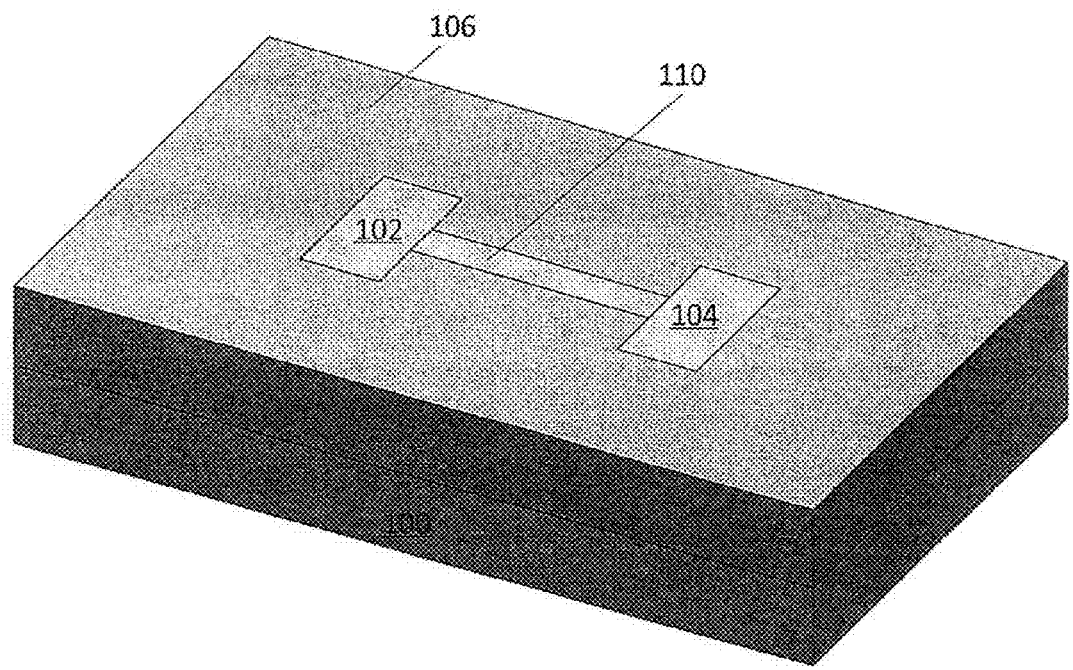
Figure 7:
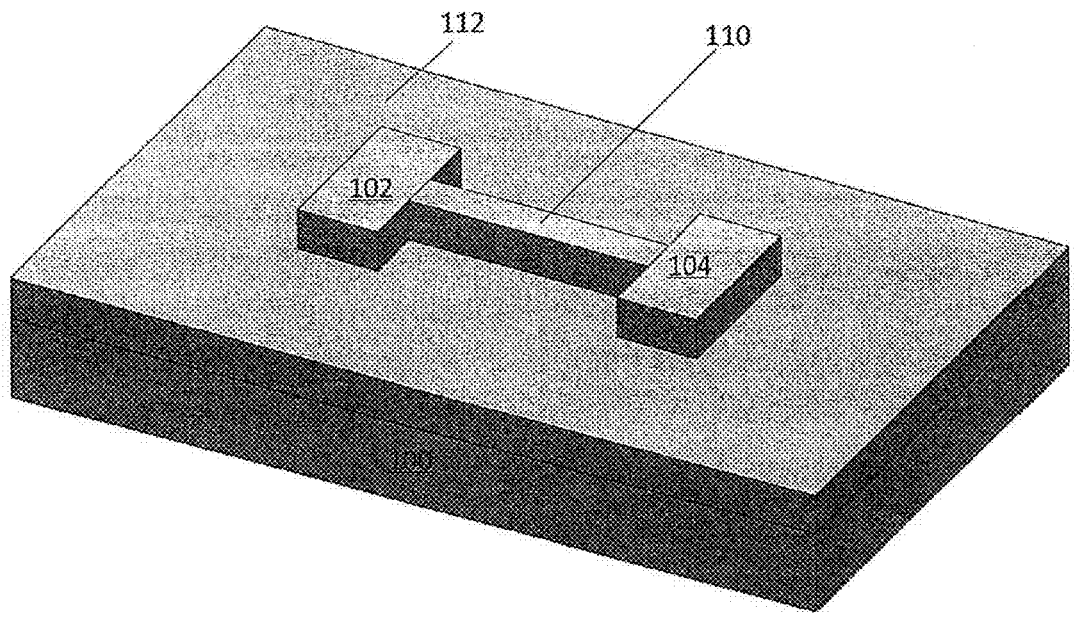

In the present embodiment, a dielectric material is deposited firstly, such as undoped silicon oxide ($SiO_2$), doped silicon oxide (e.g., borosilicate glass, boron phosphor silicate glass and the like), silicon nitride ($Si_3N_4$) or other low-K dielectric material. Afterwards, a planarization process such as CMP (chemical mechanical polishing) is implemented until the source region 102 and the drain region 104 are exposed so as to form a dielectric layer 106 on the substrate, as shown in FIG. 4. Next, the dielectric layer between the source region and the drain region is etched under a mask until the substrate 100 is exposed so as to form a fin channel region 108 in the dielectric layer, as shown in FIG. 5. The fin channel region is used to form a fin channel. Next, the fin channel is formed in the fin channel region, as shown in FIG. 6. The fin channel may be formed within the channel region by a selectively epitaxial growth. Next, the dielectric layer 106 with some certain thickness is removed to expose the fin channel 110 and the remaining dielectric layer functions as the isolation structure between the devices, as shown in FIG. 7. Of course, in the other embodiments the dielectric layer may be completely removed and an isolation structure is formed again.

Figure 8:
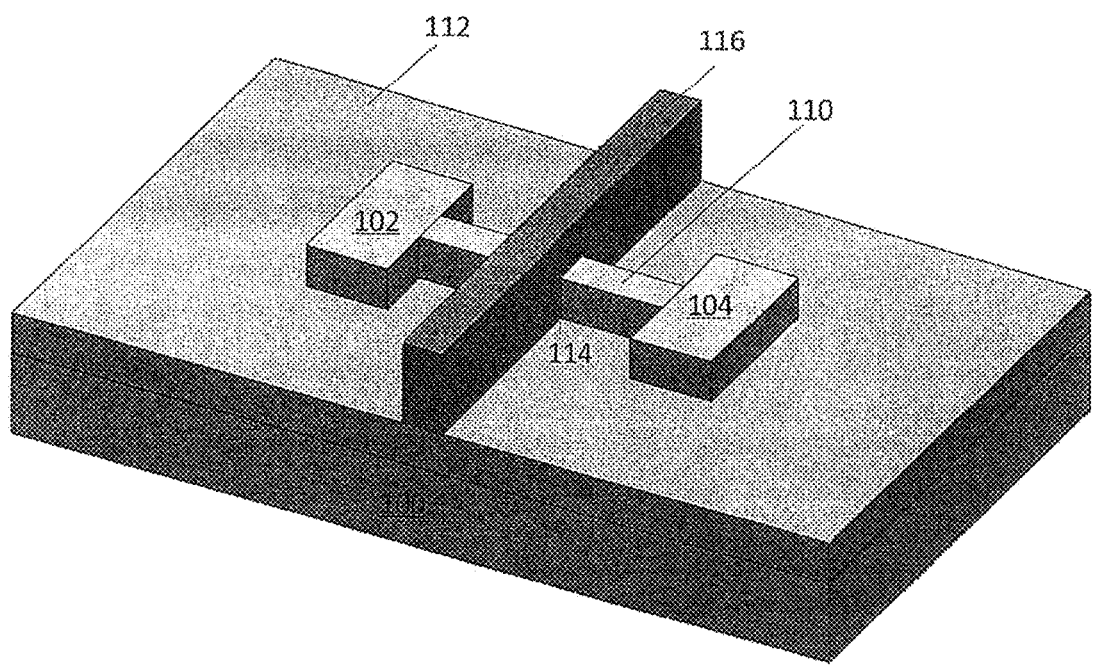
Figure 9:
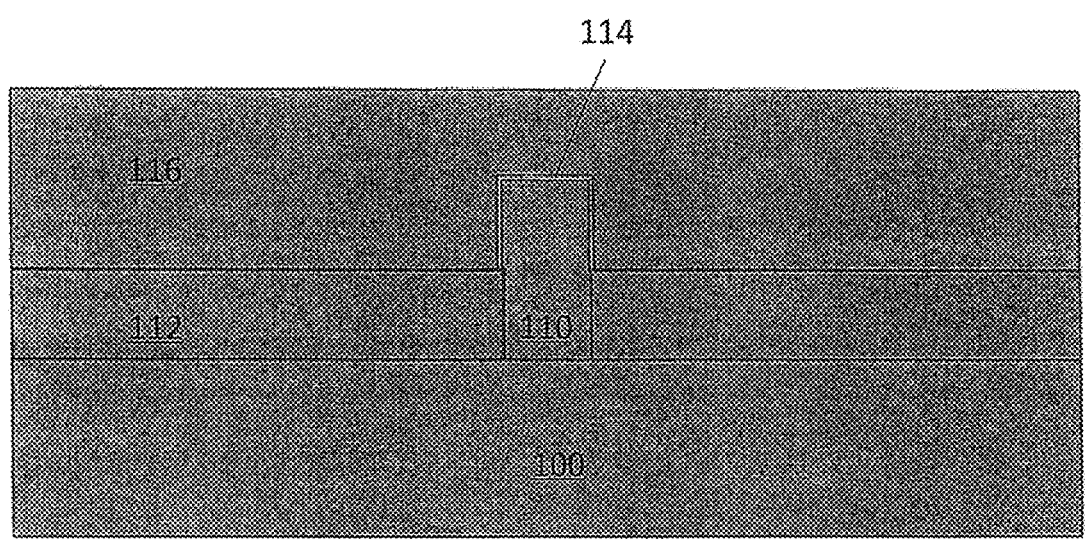
FIG. 9 is a cross sectional view along the gate direction in the FinFET shown in FIG. 8.

Next, a gate is formed on the fin channel, as shown in FIG. 8 and FIG. 9.

The step of forming the gate is identical to that of forming a gate for the conventional Fin device. In particularly, a gate dielectric layer 114, a gate electrode 116 and a cap layer (not shown in the figure) are deposited, respectively, and then are etched so as to form gates 114 and 116 on the sidewalls and top of the fin channel region, as shown in FIG. 8. The gate dielectric layer 114 may be a single layer structure or a multiple layer structure. In some embodiments of a single layer structure, the gate dielectric layer may be formed of a high-K dielectric material (e.g., a material with a high dielectric constant as compared with silicon oxide) or the other gate dielectric material. In some embodiments of a multiple layer structure, the gate dielectric layer may comprise an interface layer and a high-K dielectric material. The interface layer may be formed of silicon oxide, silicon nitride, silicon oxynitride or other material. The high-K dielectric material may be hafnium-based oxide, such as $HFO_2$, HfSiO, HfSiON, HfTaO, HfTiO and the like. The gate electrode 116 may be a single layer structure or a multiple layer structure. The gate electrode may comprise a metal gate electrode or a poly silicon gate electrode. For example, the gate electrode may comprise a material selected from a group consisting of Ti, TiAlx, TiN, TaNx, HfN, TiCx, TaCx, HfCx, Ru, TaNx, TiAlN, WCN, MoAlN, RuOx, poly silicon and other suitable material, or combinations thereto. This is only an example and the present disclosure is not limited to it.

Next, other structures for the device are formed, such as spacers, contacts, interconnect structure and the like.

What is mentioned above is the preferred embodiment of the present disclosure, and does not limit the present disclosure in any forms.

Although the present disclosure discloses the preferred embodiment as mentioned above, it is not intended to limit the present disclosure. Those skilled in the art may make various change or modification to the technical solution of the present disclosure by utilizing the method and technique as disclosed above or modify as an equivalent embodiment having substantial identical variation without departing from the scope of the present disclosure. Thus, any simple amendments, identical variation and modification to the above embodiment according to the technique of the present disclosure without departing from the technical solution of the present disclosure fall into the scope of the present disclosure.

We claim:

1. A method for manufacturing a FinFET device, comprising:
   providing a substrate;
   implementing a source/drain doping on the substrate;
   etching the doped substrate to form a source region and a drain region;
   forming a fin channel between the source region and the drain region; and forming a gate on the Fin channel;
   wherein the step of forming a fin channel between the source region and the drain region comprises:
   forming a dielectric layer on the substrate except for the source region and the drain region;
   planarizing until exposing the source region and the drain region;
   etching the dielectric layer between the source region and the drain region to form a fin channel region in the dielectric layer;
   forming a fin channel within the fin channel region; and removing the dielectric layer with some certain thickness and the remaining dielectric layer functions as an isolation structure.

2. The method according to claim 1, wherein the fin channel is formed in the fin channel region by a selectively epitaxial growth.

3. The method according to claim 1, wherein the source/drain doping on the substrate is implemented by an ion implantation or an epitaxial doping.

4. The method according to claim 1, wherein the doping concentration for the source and drain regions is larger than 1e20 cm−3.

* * * * *